(12) United States Patent
Kim

(10) Patent No.: US 7,427,553 B2
(45) Date of Patent: Sep. 23, 2008

(54) FABRICATING METHOD OF SEMICONDUCTOR DEVICE

(75) Inventor: Chang Nam Kim, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 198 days.

(21) Appl. No.: 11/320,910

(22) Filed: Dec. 30, 2005

(65) Prior Publication Data

US 2006/0148203 A1    Jul. 6, 2006

(30) Foreign Application Priority Data

Dec. 31, 2004   (KR)  ............... 10-2004-0118288

(51) Int. Cl.
*H01L 21/76* (2006.01)
(52) U.S. Cl. ............ 438/427; 438/426; 438/425; 438/424; 438/E21.55
(58) Field of Classification Search .......... 438/424–427
See application file for complete search history.

(56) References Cited

U.S. PATENT DOCUMENTS

2002/0106906 A1 * 8/2002 Ballantine et al. ........... 438/770
2004/0029398 A1   2/2004 Lee et al.
2005/0106813 A1 * 5/2005 Lee et al. ................. 438/257
2006/0258116 A1 * 11/2006 Kim et al. ................ 438/424

FOREIGN PATENT DOCUMENTS

| JP | 2000-150631 | 5/2000 |
| JP | 2003-060025 | 2/2003 |
| JP | 2003-324146 | 11/2003 |
| JP | 2004-134759 | 4/2004 |

* cited by examiner

*Primary Examiner*—Dung A. Le
(74) *Attorney, Agent, or Firm*—McKenna Long & Aldridge LLP

(57) ABSTRACT

A fabricating method of a semiconductor device is provided. The method comprises the steps of preparing a semiconductor substrate having an active area with a high voltage device area and a low voltage device area and an inactive area, forming a trench in the inactive area of the semiconductor substrate, forming a sacrifice oxide layer on an inner surface of the trench, forming a liner oxide layer on the sacrifice oxide layer, forming a gap-fill oxide layer as a device isolation layer on the liner oxide layer to fill up the trench, forming a buffer oxide layer on top surfaces of the liner and sacrifice oxide layers of the device isolation layer, and forming a gate oxide layer on the high voltage device area of the semiconductor substrate to have a uniform thickness.

4 Claims, 11 Drawing Sheets

FABRICATING METHOD OF SEMICONDUCTOR DEVICE

CROSS-REFERENCE TO RELATED APPLICATION

This application claims the benefit of Korean Patent Application No. P2004-118288, filed on Dec. 31, 2004, which is hereby incorporated by reference for all purposes as if fully set forth herein.

BACKGROUND OF THE INVENTION

1. Field of the Invention

The present invention relates to a semiconductor device, and more particularly, to a semiconductor device and fabricating method thereof. Although the present invention is suitable for a wide scope of applications, it is particularly suitable for forming a high voltage device gate oxide layer having a uniform thickness in a manner of previously performing a prescribed pre-processing on an STI edge area in forming a dual-gate oxide layer.

2. Discussion of the Related Art

Recently, as a semiconductor device design technology has gradually developed with an enhanced degree of integration, a system integrated on one semiconductor chip has been attempted. Such a one-chip implementation developing into a technology combining the functions of a controller, a memory, a circuit driven at low voltage, and other components into one chip.

To reduce the size of the system, a circuit functioning as input and output ends for adjusting power of a system may be merged into one chip. This can be enabled by unifying high voltage and low voltage transistors into one chip.

In integrating high and low voltage devices on one chip, a gate oxide layer of the high voltage device should be thicker than that of the low voltage device. Accordingly, a dual gate oxide layer is typically used. An oxide layer formed by thermal oxidation is typically preferred as the dual gate oxide layer as compared to an oxide layer formed by chemical vapor deposition (CVD). The oxide layer formed by thermal oxidation can provide a better quality oxide layer.

For a high voltage device employing a thick oxide layer as a gate oxide layer, the edge of the oxide layer is affected by the structure around its circumferential area. If the thickness of the gate oxide layer is reduced, an off-current is increased by this influence. The increase of the off-current increases static power consumption of the device to have a negative influence on the operation of the device and causes a breakdown voltage drop. As such, the increase of the off-current limits the fabrication of the high voltage device.

FIGS. 1A to 1F are cross-sectional views illustrating a conventional method of fabricating a dual gate oxide layer.

Referring to FIG. 1A, an active area and an inactive area are defined on a semiconductor substrate 10. A device isolation layer 12 is formed on the inactive area of the semiconductor substrate 10 by STI shallow trench isolation (STI).

The semiconductor device is driven by receiving high or low voltage. Semiconductor devices can be classified as a high voltage device driven at high voltage and/or a low voltage device driven at low voltage. Hence, the active area of the semiconductor substrate 10 is divided into an area for forming the high voltage device (high voltage device area) and an area for forming the low voltage device (low voltage device area) to implement both functions of the high and low voltage devices. Each of the areas is considered in designing a circuit.

Subsequently, while the inactive area is covered with a mask pattern, ion implantation is performed on the semiconductor substrate 10 to form a well region 14 in the active area.

Referring to FIG. 1B and FIG. 1C, wet oxidation is performed on the semiconductor substrate to form a first gate oxide layer 16 that is the thicker portion of a dual gate oxide layer.

A photoresist is coated over the semiconductor substrate. Exposure and development are performed to form a photoresist pattern 18 that exposes the inactive area and the low voltage device area. The first gate oxide layer 16 is then patterned by etching using the photoresist pattern 18 as a mask to form a first gate oxide layer pattern 16a on the high voltage device area only.

Referring to FIG. 1D, a prescribed photoresist strip process is carried out to remove the photoresist pattern 18. Thermal oxidation is then carried out on the low voltage device area using NO gas to form a second gate oxide layer (not shown). Subsequently, a second gate oxide layer pattern 20 corresponding to a thin part of the dual gate oxide layer is formed. In doing so, a nitride layer 19 is formed on an interface between the semiconductor substrate 10 and the second gate oxide layer pattern 20. Subsequently, a polysilicon layer 22 is formed over the semiconductor substrate to form a gate electrode.

Referring to FIG. 1E, a first gate electrode 24 for a high voltage device is formed on the high voltage device area and a second gate electrode 26 for a low voltage device is formed on the low voltage device area by selectively etching the polysilicon layer 22, the first gate oxide layer pattern 16a, and the second gate oxide layer pattern 20 simultaneously using a gate electrode pattern mask. Hence, a dual gate electrode including the first and second gate electrodes 24 and 26 is formed.

Referring to FIG. 1F, light ion implantation to form a shallow junction on the active area of the semiconductor substrate 10 is carried out to form lightly doped drain (LDD) regions 28. In doing so, the first and second gate electrodes 24 and 26 are used as a mask and are doped with predetermined ions by the light ion implantation.

Subsequently, by carrying out the prescribed deposition and etch sequentially, lightly doped drain (LDD) and high temperature low pressure dielectric (HLD) spacers 30 are formed on sidewalls of the first and second gate electrodes 24 and 26, respectively.

Source/drain regions 32 are formed by carrying out heavy ion implantation using the first and second gate electrodes 24 and 26 and the spacers 30 as a mask.

Subsequently, a metal, such as Ti, Co and the like, is deposited over the semiconductor substrate. By carrying out the prescribed annealing and etch, salicide (for example, self-aligned silicide) is formed on the first and second gate electrodes 24 and 24 and the source/drain regions 32.

In forming the dual gate oxide layer, the relatively thick first gate oxide layer is formed by wet oxidation. The first gate oxide layer is patterned by photolithography, and then removed by stripping. Subsequently, thermal oxidation fixation is carried out in the presence of NO gas to form the relatively thin second gate oxide layer.

However, in case of forming the dual gate oxide layer by the conventional method, the oxidation reaction, as shown in FIG. 2, occurs slowly at the STI edge to bring about a thinning effect such that the gate oxide layer on the high voltage device area is thinned. In this case, the quality and robustness of the gate oxide layer are degraded due to the irregular thickness of the gate oxide layer. To prevent the thinning effect, the gate oxide layer may be formed, not by thermal oxidation, but by chemical vapor deposition (CVD). The quality of the oxide layer formed by CVD may be poorer than that of the oxide layer formed by thermal oxidation.

SUMMARY OF THE INVENTION

Accordingly, the present invention is directed to a semiconductor device and fabricating method thereof that substantially obviate one or more problems that may be due to limitations and disadvantages of the related art.

The present invention provides a semiconductor device and fabricating method thereof, in which a dual gate oxide layer is formed by thermal oxidation after carrying out a prescribed pre-processing on an STI edge, which results in a high quality oxide layer by thermal oxidation, and a gate oxide layer thickness of a high voltage device area that can be uniformly maintained.

Additional advantages and features of the invention will be set forth in part in the description which follows and in part will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the invention, as embodied and broadly described herein, a semiconductor device according to the present invention includes a semiconductor substrate divided into an active area and an inactive area, the active area including a high voltage device area and a low voltage device area, a device isolation layer on the inactive area of the semiconductor substrate, and a gate oxide layer on the high voltage device area of the semiconductor substrate, the gate oxide layer having a generally uniform thickness.

The semiconductor device may further include a buffer oxide layer on an edge of the device isolation layer.

The device isolation layer can also include a sacrifice oxide layer on a portion adjacent to the active area of the semiconductor substrate, a liner oxide layer on the sacrifice layer, and a gap-fill oxide layer on the liner oxide layer.

The device isolation layer may include a liner oxide layer on a portion adjacent to the active area of the semiconductor substrate having a round cross-section at a portion contacting with a top surface of the semiconductor substrate and a gap-fill oxide layer on the liner oxide layer.

The device isolation layer may include a portion projected from a top surface of the semiconductor substrate and a lateral side of the projected portion has an angle greater than 90° relative to the top surface of the semiconductor substrate.

The gate oxide layer may include a thermal oxide layer.

In one aspect of the present invention, a method of fabricating a semiconductor device includes the steps of preparing a semiconductor substrate divided into an active area including a high voltage device area and a low voltage device area and an inactive area, forming a device isolation layer on the inactive area of the semiconductor substrate, and forming a gate oxide layer on the high voltage device area of the semiconductor substrate to have a uniform thickness.

The device isolation layer forming step may include the steps of forming a trench in the inactive area of the semiconductor substrate, forming a sacrifice oxide layer on an inner surface of the trench, forming a liner oxide layer on the sacrifice oxide layer, and forming a gap-fill oxide layer on the liner oxide layer to fill up the trench.

The device isolation layer forming step may include the steps of forming a trench in the inactive area of the semiconductor substrate, forming a liner oxide layer on an inner surface of the trench to have a round cross-section at a portion contacting with a top surface of the semiconductor substrate, and forming a gap-fill oxide layer on the liner oxide layer to fill up the trench.

The method may further include the step of etching the semiconductor substrate in the vicinity of an upper edge of the trench in the inactive area prior to forming the liner oxide layer.

The semiconductor substrate in the vicinity of the upper edge of the trench may be etched within a temperature range of 700° C. to 800° C. using mixture gas of HCl and $H_2$.

The trench forming step may include the steps of forming a nitride layer pattern on the semiconductor substrate to expose a portion corresponding to the inactive area and etching the semiconductor substrate of the exposed inactive area using the nitride layer pattern as a mask.

The method may further include the step of etching the nitride layer pattern to provide a negative ascent to a portion of the nitride layer pattern in the vicinity of an edge of the trench prior to forming the liner oxide layer. In other words, the etched portion forms an interior angle relative to the top surface greater than 90.

The device isolation layer forming step may include the steps of forming a nitride layer pattern on the semiconductor substrate to expose a portion corresponding to the inactive area, etching the nitride layer pattern to provide a positive ascent to a portion of the nitride layer pattern in the vicinity of the inactive area, forming a trench in the exposed semiconductor substrate using the etched nitride layer pattern, and forming the device isolation layer in the trench. In other words, the resulting portion of the nitride layer pattern forms an interior angle relative to the top surface less than 90.

The device isolation layer can be formed to project from a top surface of the semiconductor substrate and a lateral side of the projected portion has an angle greater than 90° against the top surface of the semiconductor substrate.

The method may further include the steps of forming an oxide layer between the device isolation layer and the semiconductor substrate and on a top surface of the semiconductor substrate by performing thermal oxidation on the entire semiconductor substrate including the device isolation layer and removing the oxide layer from the top surface of the semiconductor substrate.

The oxide layer can be 300-700 Å thick.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, illustrate exemplary embodiments of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

The present invention can employ several processes prior to forming a gate oxide layer to maintain a uniform thickness of a gate oxide layer on an STI edge area as well as to secure a high quality oxide layer using thermal oxidation in forming a high voltage device gate oxide layer using STI.

FIGS. 3A to 3D are cross-sectional views of a gate oxide layer fabricated in accordance with an exemplary first embodiment of the present invention.

Figure 1A:
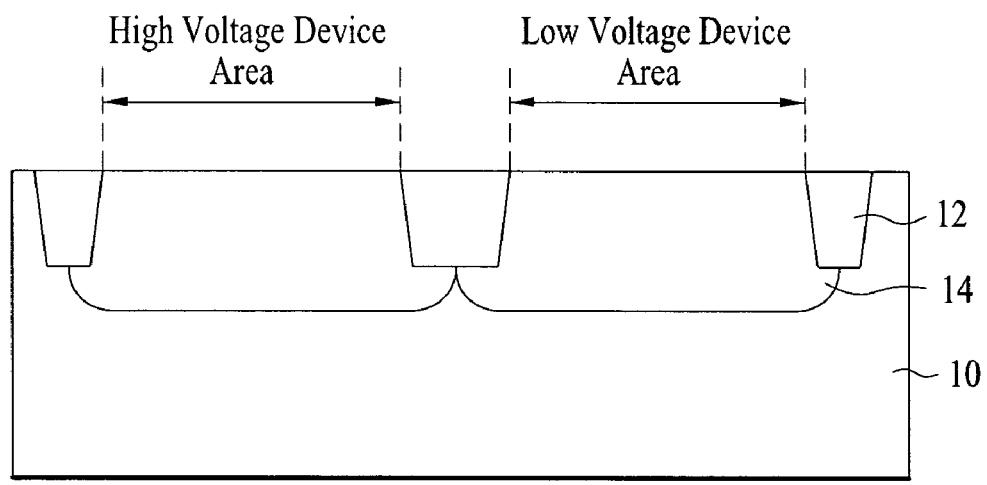
FIGS. 1A to 1F are cross-sectional views of a method of fabricating a dual gate oxide layer according to the conventional art.
Figure 1B:
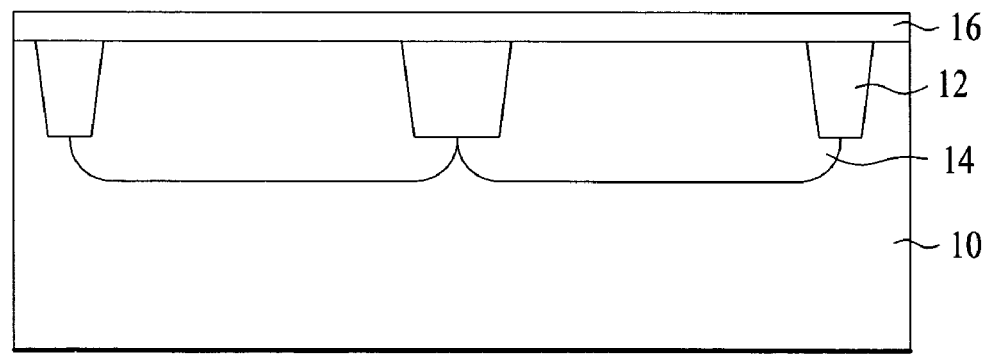
Figure 1C:
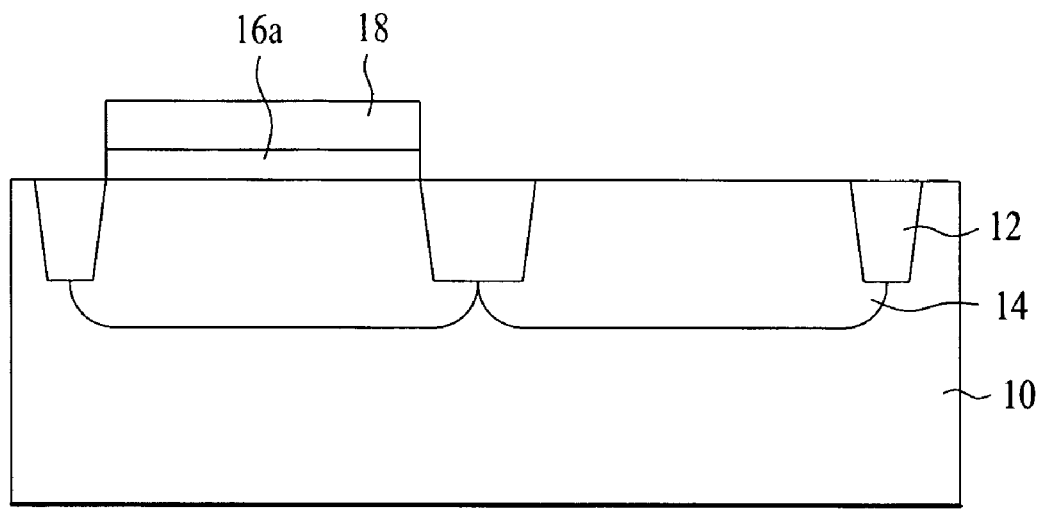
Figure 1D:
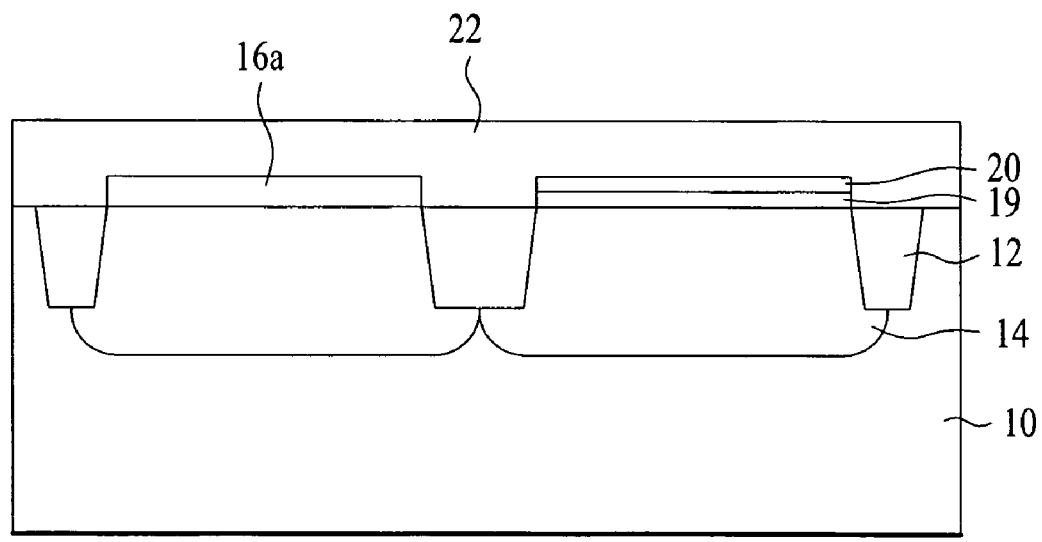
Figure 1E:
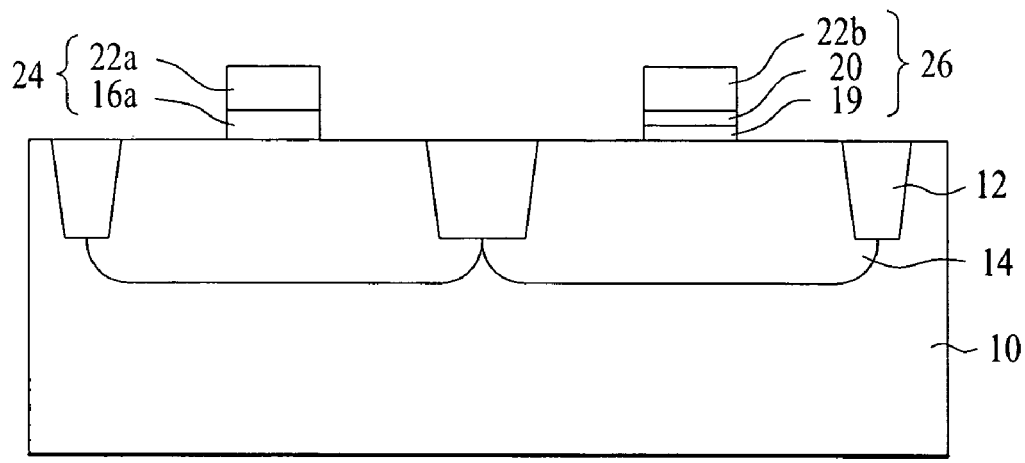
Figure 1F:
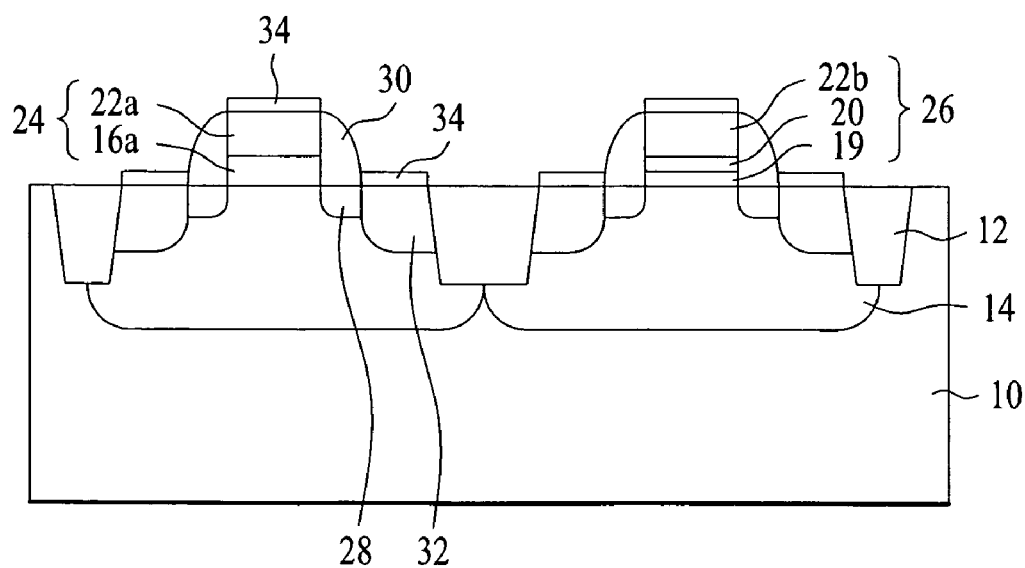
Figure 2:
FIG. 2 is a SEM picture showing a high voltage device gate oxide layer conventionally formed thin around an STI trench edge.
Figure 3A:
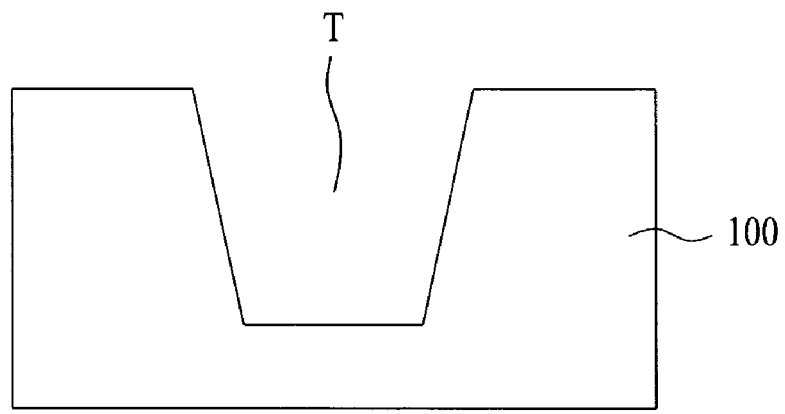
FIGS. 3A to 3D are cross-sectional views of a gate oxide layer fabricated in accordance with a first embodiment of the present invention.

Referring to FIG. 3A, an oxide layer (not shown) and a nitride layer (not shown) are sequentially stacked on a semiconductor substrate 100 that includes an active area and an inactive area (device isolation area). A photoresist pattern (not shown) is formed on the nitride layer to expose a portion of the nitride layer corresponding to the inactive area. The nitride layer, the oxide layer, and the semiconductor substrate 100 are sequentially etched using the photoresist pattern as a mask to form a trench T for STI.

Figure 3B:
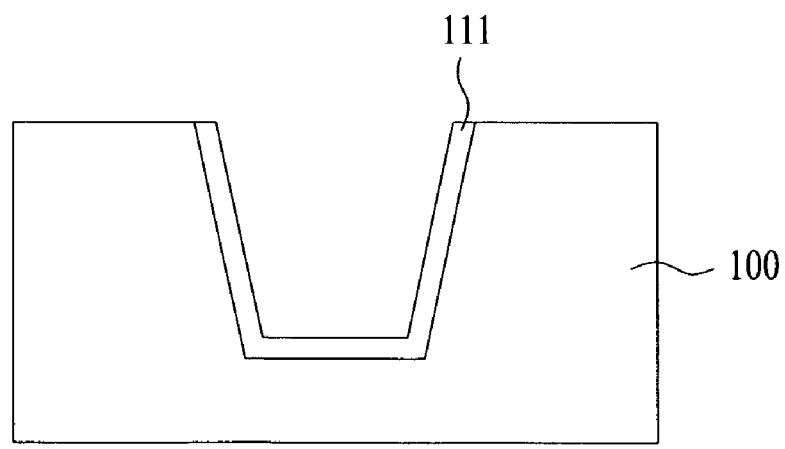
Figure 3C:
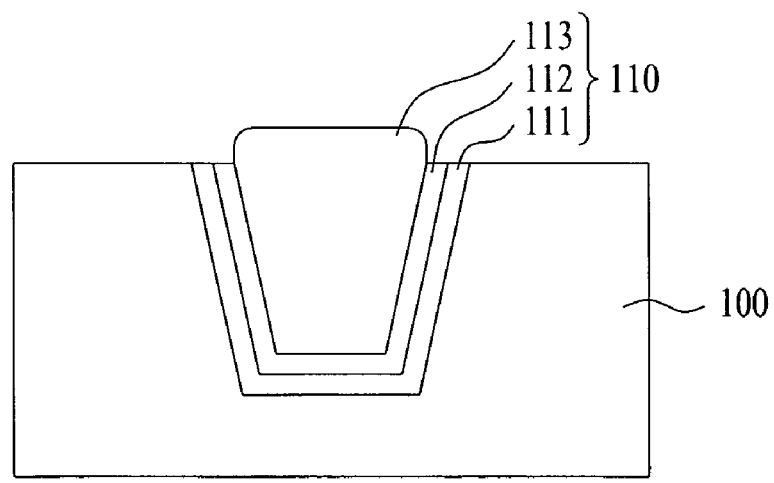

Referring to FIG. 3B and FIG. 3C, a sacrifice oxide layer 111 and a liner oxide layer 112 are sequentially formed on an inner surface of the trench T. The trench T is then filled with a gap-fill oxide layer 113. The sacrifice oxide layer 111, the liner oxide layer 112, and the gap-fill oxide layer 113 configure a device isolation layer 110 together. As such, the thickness of the device isolation layer 110 can be increased by the additional thickness of the sacrifice oxide layer 111.

Figure 3D:
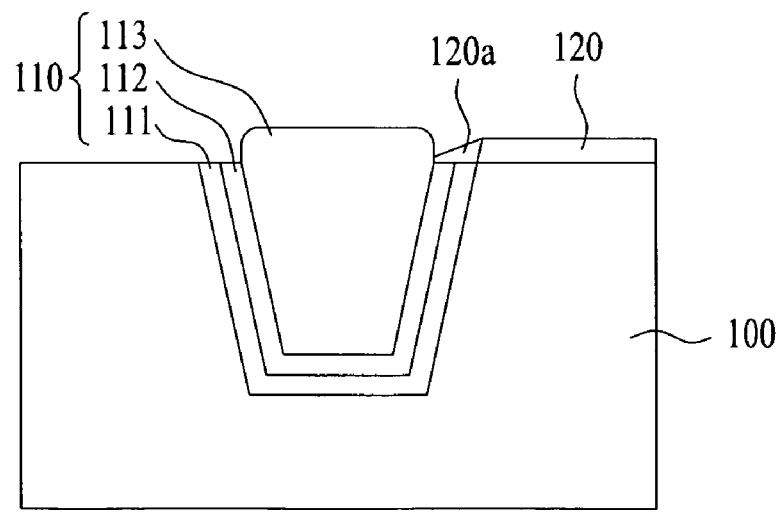

Referring to FIG. 3D, a high voltage device gate oxide layer 120 is formed on the semiconductor substrate by thermal oxidation. In doing so, a buffer oxide layer 120a is formed on the top surfaces of the liner and sacrifice oxide layers 112 and 111 of the device isolation layer 110. Specifically, the buffer oxide layer 120a can have a thickness smaller than that of the gate oxide layer 120. Due to the presence of the buffer oxide layer 120a, the gate oxide layer 120 formed on a high voltage device area of the semiconductor substrate can have a uniform thickness. In other words, in the case of forming an oxide layer by thermal oxidation, a portion of the corresponding oxide layer is relatively thin because oxidation reaction occurs slowly around the device isolation layer. Hence, the rest of the oxide layer, except the relatively thin portion of the oxide layer, is used as a gate oxide layer.

Figure 4A:
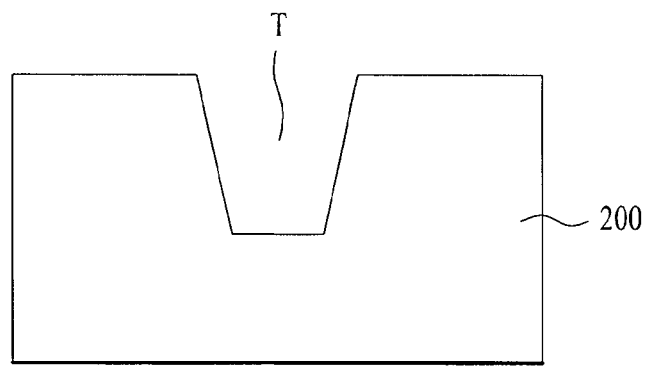
FIGS. 4A to 4C are cross-sectional views of a gate oxide layer fabricated in accordance with a second embodiment of the present invention.
Figure 4B:
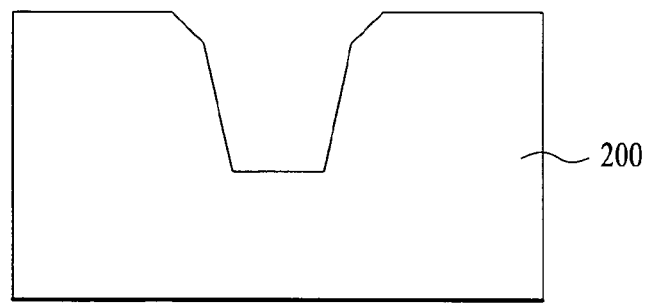
Figure 4C:
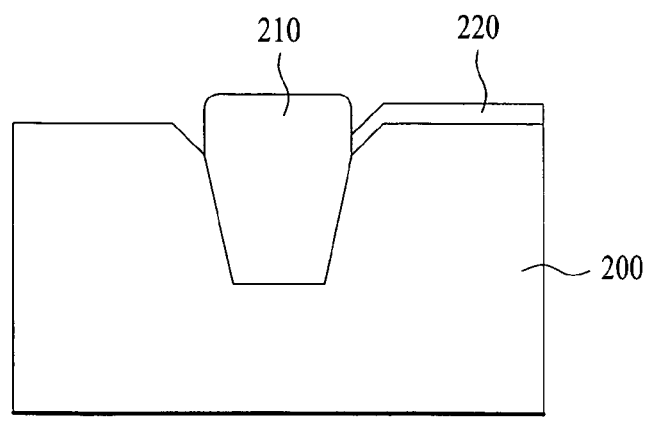

FIGS. 4A to 4C are cross-sectional views of a gate oxide layer fabricated in accordance with an exemplary second embodiment of the present invention.

Referring to FIG. 4A, an oxide layer (not shown) and a nitride layer (not shown) are sequentially stacked on a semiconductor substrate 200 that includes an active area and an inactive area (device isolation area). A photoresist pattern (not shown) is formed on the nitride layer to expose a portion of the nitride layer corresponding to the inactive area. The nitride layer, the oxide layer, and the semiconductor substrate 100 are sequentially etched using the photoresist pattern as a mask to form a trench T for STI.

Referring to FIG. 4B, an edge of the semiconductor substrate 200 in the area of an upper edge of the trench T is etched to have a gentle ascent or slope, which enables an oxidation reaction to occur sufficiently in the edge area of the trench. This can prevent a high voltage device gate oxide layer, formed later, from having an irregular thickness. The edge portion of the semiconductor substrate 200 can be etched within a temperature range of 700° C. to 800° C. using mixture gas of HCl and $H_2$. Alternatively, the edge portion can be rounded off by a sputtering process.

Referring to FIG. 4C, a device isolation layer 210 is formed in the trench T. A high voltage device gate oxide layer 220 is then formed by thermal oxidation. The thermal oxidation is carried out within a temperature range of 700° C. to 750° C. at a pressure of 200 Torr by an injection of $O_2$ gas. Accordingly, the gate oxide layer 220 can maintain a uniform thickness on an edge area of the device isolation layer 210.

FIGS. 5A to 5D are cross-sectional views of a gate oxide layer fabricated in accordance with an exemplary third embodiment of the present invention.

Figure 5A:
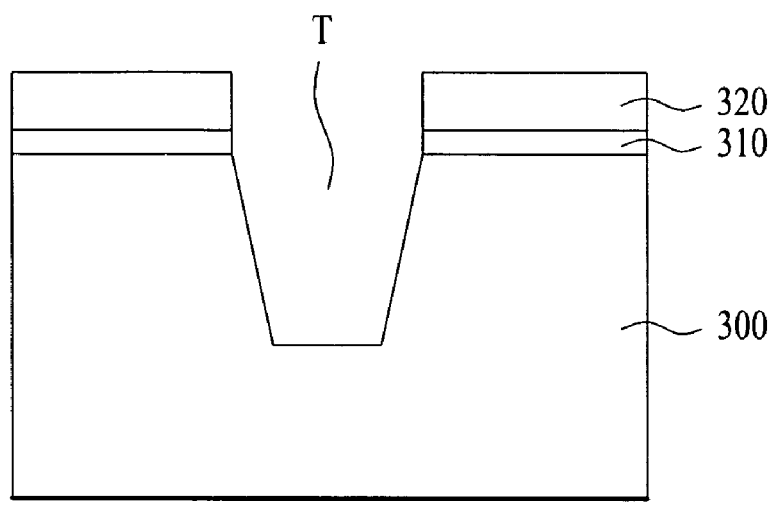
FIGS. 5A to 5D are cross-sectional views of a gate oxide layer fabricated in accordance with a third embodiment of the present invention.

Referring to FIG. 5A, an oxide layer 310 and a nitride layer 320 are sequentially stacked on a semiconductor substrate 300 that includes an active area and an inactive area (device isolation area). A photoresist pattern (not shown) is formed on the nitride layer to expose a portion of the nitride layer 320 corresponding to the inactive area. The nitride layer 320, the oxide layer 310, and the semiconductor substrate 300 are sequentially etched using the photoresist pattern as a mask to form a trench T for STI.

Figure 5B:
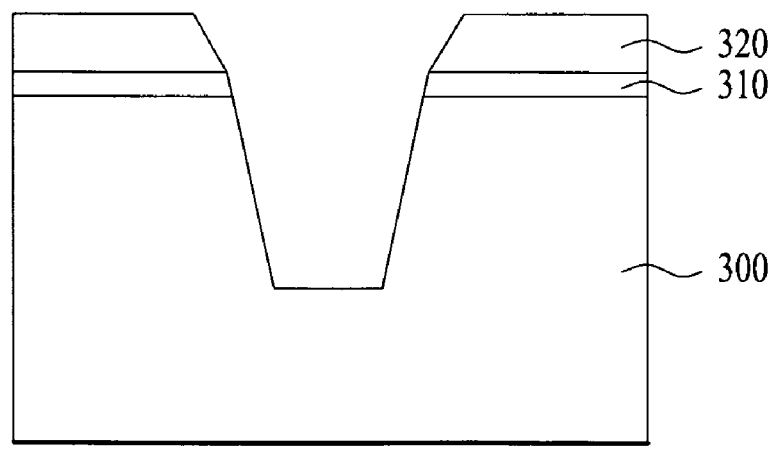
Figure 5C:
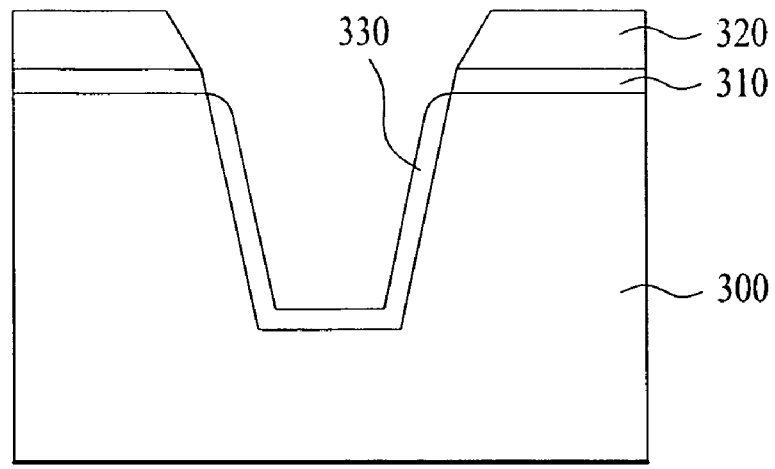

Referring to FIG. 5B and FIG. 5C, the nitride layer 320 adjacent to an edge area of the trench T is etched to form an angle, for example, with an interior angle of less than 90° relative to the top surface of the device. A liner oxide layer 330 is then formed on an inner surface of the trench T. A portion of the liner oxide layer 330 over an upper lateral side of trench T has a round cross-section to provide an environment that accelerates an oxidation reaction in the thermal oxidation performed later. Accordingly, a reduction thickness of a high voltage device gate oxide layer, which will be formed later, in the vicinity of the trench T can be prevented.

Figure 5D:
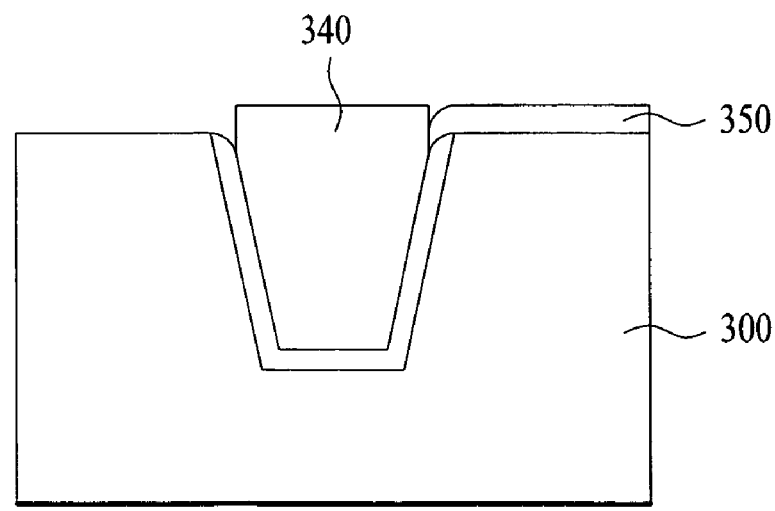

Referring to FIG. 5D, a gap fill oxide layer 340 is formed on the liner oxide layer 330 to fill up the trench T. Subsequently, a gate oxide layer 350 is formed in a high voltage device area of the semiconductor substrate 300 by thermal oxidation. Accordingly, the gate oxide layer 350 can maintain a uniform thickness.

Figure 6A:
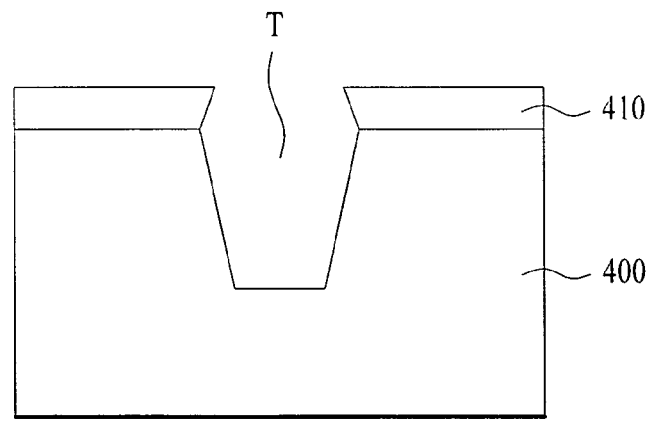
FIGS. 6A to 6C are cross-sectional views of a gate oxide layer fabricated in accordance with a fourth embodiment of the present invention.
Figure 6B:
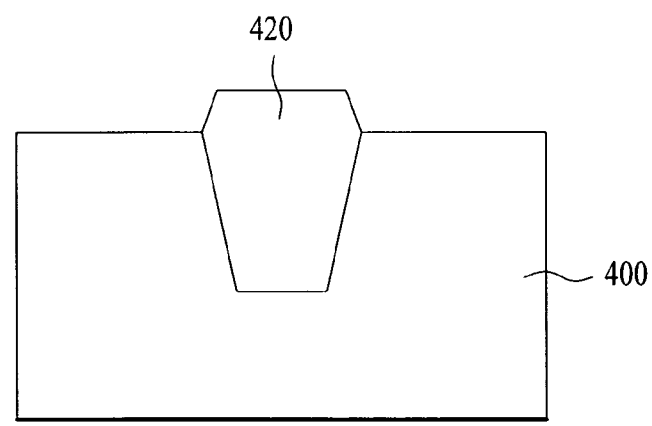
Figure 6C:
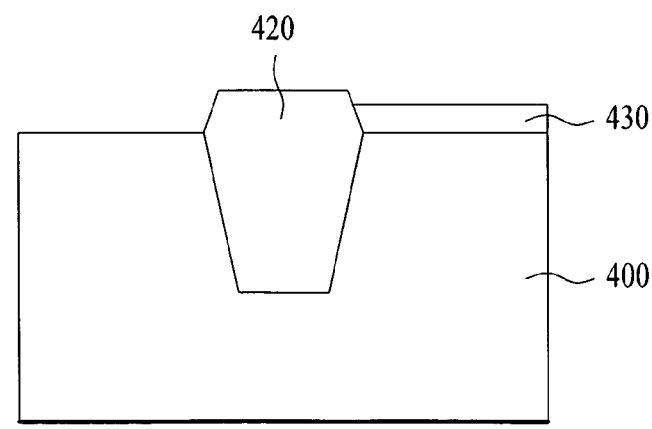

FIGS. 6A to 6C are cross-sectional views of a gate oxide layer fabricated in accordance with an exemplary fourth embodiment of the present invention.

Referring to FIG. 6A, an oxide layer (not shown) and a nitride layer (not shown) are sequentially stacked on a semiconductor substrate 400 that includes an active area and an inactive area (device isolation area). A photoresist pattern (not shown) is formed on the nitride layer to expose a portion of the nitride layer corresponding to the inactive area. The nitride layer is etched using the photoresist pattern as a mask. The etched nitride layer is then etched back again to form a nitride layer pattern 410 with an interior angle less than 90° relative to the surface of the device. The semiconductor substrate is then etched using the nitride layer pattern 410 as a mask to form a trench T for STI.

Referring to FIG. 6B, a device isolation layer 420 is formed within the trench T by thermal oxidation. A portion of the device isolation layer 420 projects from the upper surface of the semiconductor substrate 400 has to the nitride layer pattern 410. In other words, the projecting isolation layer 420 has a positive slope.

Referring to FIG. 6C, a gate oxide layer 430 is formed on a high voltage device area of the semiconductor substrate 400 by thermal oxidation. As the portion of the device isolation layer 420 projecting from the surface of the semiconductor substrate 400 has the positive angle, i.e., an exterior angle greater than 90° relative to the surface, an oxidation reaction actively occurs on a surface of the semiconductor substrate 400 in the area of the device isolation layer 420. Accordingly, it is able to obtain the gate oxide layer having a uniform thickness overall.

Figure 7A:
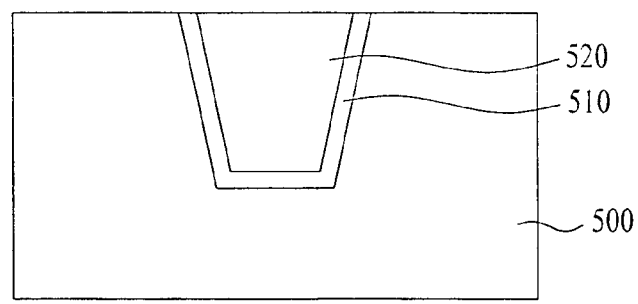
FIGS. 7A to 7C are cross-sectional views of a gate oxide layer fabricated in accordance with a fifth embodiment of the present invention.
Figure 7B:
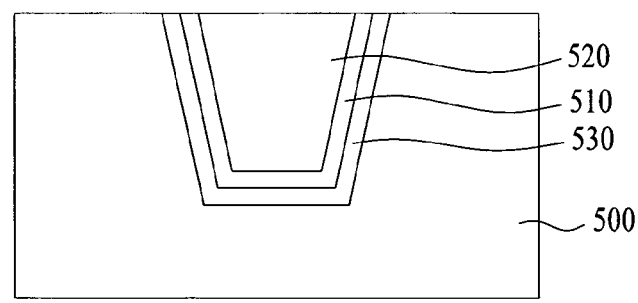
Figure 7C:
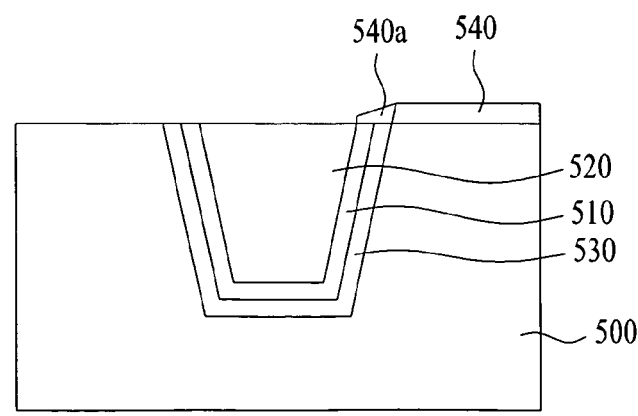

FIGS. 7A to 7C are cross-sectional views of a gate oxide layer fabricated in accordance with an exemplary fifth embodiment of the present invention.

Referring to FIG. 7A, a trench is formed on an inactive area of a semiconductor substrate 500. A liner oxide layer 510 is formed on an inner surface of the trench. A gap-fill oxide layer 520 is formed on the liner oxide layer 510 to fill up the trench. chemical mechanical polishing (CMP) is then carried out to planarize the substrate.

Referring to FIG. 7B, thermal oxidation is carried out on the semiconductor substrate to form a sacrifice oxide layer 530 within the semiconductor substrate in the area of the liner oxide layer 510 as well as on a top surface of the semiconductor substrate. The sacrifice oxide layer is then removed from the top surface of the semiconductor substrate by etching.

Referring to FIG. 7C, a gate oxide layer 540 is formed on a high voltage device area of the semiconductor substrate 500 by thermal oxidation. In doing so, a buffer oxide layer 540a is generated on the liner oxide layer 510 and the sacrifice oxide layer 530 together with gate oxide layer 540. The buffer oxide layer 540a is formed thinner than the gate oxide layer 540. Hence, the gate oxide layer 540 on the high voltage device area of the semiconductor substrate 500 can maintain a uniform thickness attributed to the presence of the buffer oxide layer 540a. In other words, in case of forming an oxide layer by thermal oxidation, an oxidation reaction occurs slowly around the device isolation layer to generate a thin oxide layer. The remaining portion of the oxide layer, except the thin portion, is used as a gate oxide layer.

In the above description of the exemplary embodiments of the present invention, portions on a silicon surface of an STI gap-fill oxide layer are contracted toward a center of the STI from an edge of the STI. In a thick gate oxide layer on a high device voltage area, more silicon can be formed on an edge surface. In particular, by preventing the thickness of the gate oxide layer formed on the high voltage device area from thinning toward the STI edge from the STI center, the gate oxide layer can maintain its uniform thickness. Hence, an oxide layer having good electric characteristics and a high quality can be formed by thermal oxidation.

Accordingly, in the semiconductor device and fabricating method thereof according to the present invention, a dual gate oxide layer is formed by thermal oxidation after carrying out a prescribed pre-processing on an STI edge area. Hence, a gate oxide layer thickness of a high voltage device area can be uniformly maintained despite thermal oxidation to secure good electric characteristics and to obtain a high quality oxide layer by thermal oxidation better than that of an oxide layer by CVD.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a semiconductor device, comprising the steps of:
    preparing a semiconductor substrate having an active area with a high voltage device area and a low voltage device area and an inactive area;
    forming a trench in the inactive area of the semiconductor substrate;
    forming a sacrifice oxide layer on an inner surface of the trench;
    forming a liner oxide layer on the sacrifice oxide layer;
    forming a gap-fill oxide layer as a device isolation layer on the liner oxide layer to fill up the trench;
    forming a buffer oxide layer on top surfaces of the liner and sacrifice oxide layers of the device isolation layer; and
    forming a gate oxide layer on the high voltage device area of the semiconductor substrate to have a uniform thickness.

2. A method of fabricating a semiconductor device, comprising the steps of:
    preparing a semiconductor substrate having an active area with a high voltage device area and a low voltage device area and an inactive area;
    forming a nitride layer pattern on the semiconductor substrate to expose a portion corresponding to the inactive area;
    etching the semiconductor substrate of the exposed portion using the nitride layer pattern as a mask, to form a trench in the inactive area of the semiconductor substrate;
    etching a portion of the nitride layer pattern in the vicinity of an edge of the trench such that the etched portion forms an interior angle of less than 90° relative to the top surface of the device;
    forming a liner oxide layer on an inner surface of the trench to have a rounded cross-section at a portion contacting with a top surface of the semiconductor substrate;
    forming a gap-fill oxide layer on the liner oxide layer to fill up the; and
    forming a gate oxide layer on the high voltage device area of the semiconductor substrate to have a uniform thickness.

3. A method of fabricating a semiconductor device, comprising the steps of:
    preparing a semiconductor substrate having an active area with a high voltage device area and a low voltage device area and an inactive area;
    forming a nitride layer pattern on the semiconductor substrate to expose a portion corresponding to the inactive area;
    etching a portion of the nitride layer pattern at the inactive area such that the portion of nitride layer pattern has an interior angle less than 90° relative to the top surface of the device;
    forming a trench in the exposed semiconductor substrate using the etched nitride layer pattern;
    forming the device isolation layer in the trench as the etched nitride layer pattern remains on the substrate; and
    forming a gate oxide layer on the high voltage device area of the semiconductor substrate to have a uniform thickness.

4. The method of claim 3, wherein the device isolation layer is formed projecting from a top surface of the semiconductor substrate, and wherein a lateral side of the projected portion has an exterior angle greater than 90° relative the top surface of the semiconductor substrate.

* * * * *